United States Patent

Frey et al.

[11] Patent Number: 4,667,046
[45] Date of Patent: May 19, 1987

[54] METHOD FOR PREPARING ORGANOPOLYSILANES AND THEIR USES

[75] Inventors: Volker Frey; Bernd Pachaly; Norbert Zeller, all of Burghausen, Fed. Rep. of Germany

[73] Assignee: Wacker-Chemie GmbH, Munich, Fed. Rep. of Germany

[21] Appl. No.: 902,540

[22] Filed: Sep. 2, 1986

[30] Foreign Application Priority Data

Sep. 10, 1985 [DE] Fed. Rep. of Germany ....... 3532128

[51] Int. Cl.$^4$ .............................. C07F 7/08; C07F 7/18
[52] U.S. Cl. ................................................... 556/430
[58] Field of Search ....................................... 556/430

[56] References Cited

U.S. PATENT DOCUMENTS

| | | | |
|---|---|---|---|
| 3,146,248 | 8/1964 | Alsgaard et al. | 556/430 |
| 4,298,558 | 11/1981 | Baney et al. | 556/430 X |
| 4,578,495 | 3/1986 | Soula et al. | 556/430 X |

Primary Examiner—Paul F. Shaver

[57] ABSTRACT

Organopolysilanes are prepared by reacting at least one disilane of the formula $$R_2R^1Si_2(OCH_3)_3,$$

which may optionally be mixed with a compound of the formula $$R_2Si_2(OCH_3)_4,$$

with at least one compound of the formula $$R_2R^2SiH$$

in the presence of at least one compound of the formula $$MOR,$$

where R represents the same or different monovalent alkyl, alkenyl or aryl groups, $R^1$ represents the same or different monovalent alkyl groups, $R^2$ represents a methoxy group or R and M represents an alkali metal. These organopolysilanes are preferably used in preparing silicon carbide and in preparing negative photoresist coatings.

4 Claims, No Drawings

METHOD FOR PREPARING ORGANOPOLYSILANES AND THEIR USES

The present invention relates to organopolysilanes and more particularly to a method for preparing organopolysilanes having more than seven silicon atoms per molecule.

BACKGROUND OF THE INVENTION

Organopolysilanes and their methods of preparation are generally known and described in, for example, U.S. Pat. No. 3,399,223 to Atwell et al in which organopolysilanes having up to seven silicon atoms per molecule are produced in very low yields. Also, U.S. Pat. No. 4,374,793 to Koga et al describes the preparation of organopolysilanes which are unmeltable and insoluble.

A two-stage method for preparing organopolysilanes having SiOC-bonded methoxy groups is described in U.S. Re. Pat. No. 31,447 to Baney et al, in which methylhalodisilanes are treated with catalysts such as $(C_4H_9)_4P^+Cl^-$ to form polyhalosilanes. The resultant polyhalosilanes are then reacted with an alkoxylating reagent in an anhydrous environment to form the polysilane.

It is, therefore, an object of this invention to provide a single stage method for preparing organopolysilanes which are meltable and soluble in an organic solvent. Another object of the present invention is to provide a method for preparing organopolysilanes having more than seven silicon atoms per molecule and which have a monomodal and symmetric molecular weight distribution. Still another object of the present invention is to provide organopolysilanes which are free of Si-bonded halogen and which do not self-ignite when exposed to air. A further object of the present invention is to provide a method for preparing organopolysilanes which absorb ultraviolet light having a wave length of less than 360 nanometers and which can be crosslinked by such light. A still further object of the present invention is to provide a method for preparing organopolysilanes having the aforementioned characteristics in relatively high yields.

SUMMARY OF THE INVENTION

The foregoing objects and others which will become apparent from the following description are accomplished in accordance with this invention, generally speaking, by providing a method for preparing organopolysilanes, which comprises reacting at least one methoxy containing disilane with an SiH containing organosilane in the presence of at least one alcoholate of the formula

MOR, where R is a monovalent hydrocarbon radical selected from alkyl, alkenyl and aryl groups and m is an alkali metal, to form an organopolysilane having more than seven silicon atoms in the molecule.

The resultant organopolysilanes melt at temperatures in the range of from 50° C. to 200° C. and are soluble in aromatic hydrocarbons such as chlorinated hydrocarbons and in tetrahydrofuran.

DETAILED DESCRIPTION OF THE INVENTION

The organopolysilanes of this invention are prepared by reacting at least one disilane of the formula $R_2R^1Si_2(OCH_3)_3$, and optionally a disilane of the formula $R_2Si_2(OCH_3)_4$, with at least one compound of the formula $R_2R^2SiH$ in the presence of at least one compound of the formula

MOR, where R represents the same or different monovalent hydrocarbon radicals selected from alkyl, alkenyl and aryl groups, $R^1$ represents the same or different monovalent alkyl groups, $R^2$ represents the methoxy group or R and m is an alkali metal.

Examples of preferred alkyl groups represented by R, $R^1$ and $R^2$ are the methyl, ethyl, n-propyl, isopropyl, n-butyl, sec-butyl and the 2-ethylhexyl radical as well as the dodecyl radicals. Preferred examples of aryl radicals represented by R and $R^2$ are the phenyl and xenyl radicals. Because of its availability, the preferred alkyl groups represented by R, $R^1$ and $R^2$ are methyl radicals. A preferred example of an alkenyl radical represented by R is the vinyl radical. An additional example of an R radical in the compound having the formula

MOR is the tert-butyl radical.

The alkali metal can be lithium, sodium, potassium, rubidium or cesium. Sodium and potassium are the preferred alkali metals in the compound having the formula

MOR.

Examples of disilanes which are preferably used in the method of this invention are 1,1,2-trimethyl-1,2,2-trimethoxydisilane, 1-phenyl-1,2-dimethyl-1,2,2-trimethoxydisilane and 1-vinyl-1,2-dimethyl-1,2,2-trimethoxydisilane. A preferred example of a compound of the formula $R_2Si_2(OCH_3)_4$ is 1,2-dimethyl-1,1,2,2-tetramethoxydisilane.

Methods for preparing such silanes are generally known and are described, for example, in E. Hengge et al, in "Monatshefte fur Chemie" Vol. 105, (1974), pages 671 through 683; W. H. Atwell et al in "Journal of Organometallic Chemistry", Vol. 7, (1967), pages 71 and 78; E. Hengge et al in "Monatshefte fur Chemie", Vol. 99, (1968), pages 340 through 346; and H Watanbe et al in "Journal of Organometallic Chemistry", Vol. 128, (1977), pages 173 through 175.

When disilanes of the formula $R_2Si_2(OCH_3)_4$ are also used, they are preferably used in an amount of from about 0.5 mol to about 1.5 mols per mol of disilane of the formula $R_2R^1Si_2(OCH_3)_3$.

Examples of compounds of the formula $R_2R^2SiH$ which are preferably used in the method of this invention are dimethylmethoxysilane and diphenylmethylsilane.

It is preferred that the compounds having the formula $R_2R^2SiH$ be used in an amount of from about 0.5 to about 5 percent by weight, and more preferably from about 2 to about 4 percent by weight, based on the weight of the disilane used.

Specific examples of compounds having the following formula

MOR which may be used in the method of this invention, are sodium methylate and potassium tert-butylate.

The compound having the formula

MOR is used as a catalyst in the method of this invention for preparing organopolysilanes. It is preferably employed in an amount of from 0.2 to 0.5 percent by weight, based on the total weight of the disilane used.

The reaction takes place after the reactants and the catalyst have been mixed at temperatures between 25° C. and 220° C., and is terminated when the organomethoxysilane monomer is no longer distilled off.

The reaction is preferably carried out at atmospheric pressure, i.e., at 1020 hPa (abs.) or at approximately 1020 hPa (abs.). However, higher or lower pressures may be used as well.

The Si-bonded hydrogen in the compounds prepared in accordance with this invention can be converted into alkoxy groups by reacting these compounds with, for example, methanol in the presence of a catalyst which does not interfere with the silicon-silicon bond, such as for example $H_2PtCl_6.6H_2O$.

The organopolysilanes of this invention may be used for any of the purposes for which organopolysilanes could have been used heretofore, such as for example, in manufacturing silicon carbide by heating the organopolysilanes to a temperature in excess of 700° C. in an inert atmosphere. They are, however, preferably used in preparing negative photo-resist coatings, such as in manufacturing printed circuit boards and semiconductor components requiring negative photo-resist organopolysilane coatings. In preparing negative photo-resist coatings, the organopolysilanes of this invention are applied to a smooth substrate such as a semiconductor chip, followed by exposure to light through a mask, and then the sections of the organopolysilane coating which were protected from the light are separated from those portions of the crosslinked coating which were exposed to light, with the aid of a solvent such as toluene.

In the following examples, all percentages are by weight unless otherwise specified.

EXAMPLE 1

About 1000 g of 1,1,2-trimethyl-1,2,2-trimethoxydisilane are mixed with 30 g (3 percent by weight based on the weight of the disilane) of diphenylmethylsilane and 3 g (0.3 percent by weight based on the total weight of the disilane used) of sodium methylate. After the mixture attains a temperature of 25° C., it increases rapidly to approximately 90° C. without any heat being supplied from an outside source. The mixture is then heated to 200° C., during which time 700 g of a mixture consisting of methyltrimethoxysilane and dimethyldimethoxysilane are distilled off. About 330 g of residue are obtained which are dissolved in 250 ml of toluene in order to separate the sodium methylate and the undesirable low molecular weight oligomers. The resultant mixture is cooled to 0° C. and mixed with acetone at a temperature of 0° C. A white precipitate is obtained, which is filtered and dried at 16 hPa (abs.). The product consists of 264 g of an organopolysilane having the formula $(C_6H_5)_2(CH_3)Si[Si(CH_3)_2]_n(SiCH_3)_mH$ where the sum of m+n has an average value of approximately 30. The average molecular weight of the resultant organopolysilane is approximately 1940. It has a symmetrical monomodal molecular weight distribution and softens at temperatures between 100 and 150° C. to form a melt. It absorbs ultraviolet light in the range between 200 and 350 nanometers. In the infrared spectrum it exhibits a strong absorption band at 2070 cm$^{-1}$.

When potassium tert-butylate is substituted for the sodium methylate, essentially the same result is obtained.

EXAMPLE 2

About 1,000 g of 1,1,2-trimethyl-1,2,2-trimethoxydisilane are mixed with 30 g (3 percent by weight based on the weight of the disilane) of dimethylmethoxysilane and 4 g (0.4 percent based on the weight of the disilane) of sodium methylate. After the mixture attains a temperature of 25° C., it rapidly increases to a temperature of approximately 90° C. without any external heat source. Thereafter, the mixture is heated to 200° C. and 700 g of a mixture consisting of methyltrimethoxysilane and dimethyldimethoxysilane are distilled off. About 330 g of residue are obtained which is then dissolved in 250 ml of tetrahydrofuran in order to separate the sodium methylate and the undesirable low molecular weight oligomers. The resultant solution is cooled to 0° C. and mixed with 750 ml of 0° C. methanol. A white precipitate is obtained which is filtered and dried at 16 hPa (abs). The product consists of 270 g of an organopolysilane having the formula $(CH_3)_2(OCH_3)Si[Si(CH_3)_2]_{n^1}(SiCH_3)_{m^1}H$ wherein the sum of $m^1+n^1$ has an average value of about 20. The average molecular weight of this organopolysilane is approximately 1250. It has a symmetrical, monomodal molecular weight distribution and forms a melt at a temperature of from 80° C. to 150° C. It absorbs ultraviolet light in the range between 200 and 350 nanometers. In the infrared spectrum, it displays a strong absorption band at 2070 cm$^{-1}$.

When potassium tert-butylate is substituted for sodium methylate, essentially the same result is obtained.

EXAMPLE 3

A 4-inch silicon wafer is spin-coated with 2 g of the organopolysilane prepared in accordance with the procedure described in Example 1, in which the polysilane has been dissolved in 40 ml of toluene. After a prebake at 100° C. for 15 minutes, the wafer is irradiated for 2 seconds with a 450 watt mercury low pressure ultraviolet lamp emitting a maximum of 253.7 nanometers through a 5-inch chrome-on-quartz test mask. Subsequently, the wafer is immersed in toluene in order to remove the polysilane which was not crosslinked because it was not exposed to ultraviolet light. A distinct, sharply-defined pattern is obtained on the wafer with a minimum line width of 0.75 micrometers.

EXAMPLE 4

About 213 g (1.09 mol) of 1,1,2-trimethyl-1,2,2-trimethoxydisilane are mixed with 142 g (0.68 mol) of 1,2-dimethyl-1,1,2,2-tetramethoxydisilane, and 10.7 g (3 percent by weight based on the total weight of the disilanes used) of diphenylmethylsilane and 1.1 g (0.3 percent by weight based on the total weight of the disilanes used) of sodium methylate. After reaching a temperature of 25° C., the temperature of the resultant mixture rapidly increases to about 90° C. without any external heat source. The mixture is then heated to 200° C., during which time 277 g of a mixture of dimethyldimethoxysilane and methyltrimethoxysilane are distilled off. About 90 g of a residue are obtained. In order to separate the sodium methylate and the undesirable low molecular weight oligomers, the precipitate is dissolved in 80 ml of toluene. The resultant solution is cooled to 0° C. and mixed with 250 ml of acetone having a temperature of 0° C. A white precipitate is obtained, which is filtered and dried at 16 hPa (abs). The product consists of 78 g of an organopolysilane having an average of 39 Si atoms per molecule. The average molecular weight of this organopolysilane is approximately 2400. It has a symmetrical, monomodal molecular weight distribution and softens at between 100 and 150° C. to form a melt. It absorbs ultraviolet light in the range between 200 and 350 nanometers. In the infrared spectrum it has a strong absorption band at 2070 $cm^{-1}$.

When potassium tert-butylate is substituted for sodium methylate, essentially the same result is obtained.

EXAMPLE 5

About 120 g (0.57 mol) of 1,2-dimethyl-1,1,2,2-tetramethoxydisilane are mixed with 180 g (0.98 mol) of 1,1,2-trimethyl-1,2,2-trimethoxydisilane, 8.1 g (2.7 percent by weight based on the total weight of the disilanes) of dimethylmethoxysilane and 1.2 g (0.4 percent by weight based on the total weight of the disilanes) of sodium methylate. When the temperature of the mixture reaches 25° C., it quickly and spontaneously increases to about 90° C. without any external heat source. The mixture is then heated to 200° C., during which time 223 g of a mixture of dimethyldimethoxysilane and methyltrimethoxysilane are distilled off. About 86 g of a residue is obtained which is dissolved in 80 ml of tetrahydrofuran in order to separate the sodium methylate and the undesirable low molecular weight oligomers. The resultant solution is cooled to 0° C. and mixed with 250 ml of 0° C. methanol. A white precipitate is obtained which is filtered and dried at 16 hPa (abs). The resultant product consists of 58 g of an organopolysilane having an average of 31 silicon atoms per molecule. The average molecular weight of this organopolysilane is approximately 1800. It has a symmetrical, monomodal molecular weight distribution and softens at between 80 and 150° C. to form a melt. It absorbs ultraviolet light in the range between 200 and 350 nanometers. In the infrared spectrum it has a strong absorption band at 2070 $cm^{-1}$.

Essentially, the same result is obtained when the potassium tert-butylate is substituted for the sodium methylate.

EXAMPLE 6

About 50 g of the organopolysilane prepared in accordance with Example 2 are heated under argon to 1300° C. at a rate of about 200° C. per hour. After cooling to room temperature, 22.5 g of black silicon carbide granules are obtained.

What is claimed is:

1. A method for preparing an organopolysilane, which comprises reacting at least one disilane of the formula $$R_2R^1Si_2(OCH_3)_3$$

with at least one compound of the formula $$R_2R^2SiH$$

in the presence of at least one compound of the formula $$MOR$$

where R is a monovalent hydrocarbon radical selected from the group consisting of an alkyl, alkenyl and aryl radical, $R^1$ is an alkyl radical, $R^2$ is selected from the group consisting of a methoxy radical and R, and M is an alkali metal.

2. The method of claim 1, wherein a mixture containing a disilane of the formula $$R_2R^1Si_2(OCH_3)_3$$

and a disilane of the formula $$R_2Si_2(OCH_3)_4$$

is reacted with at least one compound of the formula $$R_2R^2SiH,$$

where R is a monovalent hydrocarbon radical selected from the group consisting of an alkyl, alkenyl and aryl radical, $R^1$ is an alkyl radical and $R^2$ is selected from the group consisting of a methoxy radical and R.

3. The method of claim 1, wherein the reaction is conducted at a temperature of from about 25 to about 220° C.

4. The method of claim 2, wherein the reaction is conducted at a temperature of from about 25 to about 220° C.

* * * * *